US006871016B2

(12) United States Patent
Constable

(10) Patent No.: US 6,871,016 B2
(45) Date of Patent: Mar. 22, 2005

(54) RECYCLABLE CAMERA AND METHOD FOR ASSEMBLING SAME

(75) Inventor: Douglas W. Constable, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/033,560

(22) Filed: Dec. 27, 2001

(65) Prior Publication Data

US 2003/0123864 A1 Jul. 3, 2003

(51) Int. Cl.[7] .............................................. G03B 15/05
(52) U.S. Cl. ......................... 396/6; 396/206; 396/542
(58) Field of Search .......................... 396/198, 6, 541, 396/542, 543, 151, 156, 203, 205, 206, 48, 155; 315/151, 214 P, 203

(56) References Cited

U.S. PATENT DOCUMENTS

| 3,517,255 A | 6/1970 | Hoffer et al. ............... 315/151 |
| 3,519,879 A | 7/1970 | Ogawa ...................... 315/151 |
| 3,864,600 A | 2/1975 | Schneider ............... 315/241 P |
| 4,001,640 A | 1/1977 | Biber ..................... 315/241 P |
| 4,082,983 A | 4/1978 | Adams, Jr. .............. 315/241 P |
| 4,084,167 A | 4/1978 | Iwata ......................... 396/205 |
| 4,184,729 A | 1/1980 | Parks et al. ................... 439/66 |
| 4,196,458 A | 4/1980 | Kondo ......................... 362/10 |
| 4,322,143 A | 3/1982 | Mailanda ................... 396/203 |
| 4,348,087 A | 9/1982 | Ellin et al. .................. 396/105 |
| 4,438,561 A | 3/1984 | Mueller ....................... 29/831 |
| 4,924,149 A | 5/1990 | Nishida et al. .......... 315/241 P |
| 5,060,370 A | 10/1991 | Scales, Jr. et al. ............ 29/846 |
| 5,329,330 A | 7/1994 | Sakai et al. ..................... 396/6 |
| 5,574,337 A | 11/1996 | Dunsmore ............... 315/241 P |
| 5,708,878 A | 1/1998 | Suh ............................ 396/206 |
| 5,717,962 A | 2/1998 | Sasaki et al. ............... 396/156 |
| 5,721,986 A | 2/1998 | Nomura et al. ............. 396/205 |
| 5,814,948 A | 9/1998 | Teremy .................. 315/241 P |
| 6,434,342 B1 * | 8/2002 | Nakano et al. .............. 396/541 |
| 6,462,780 B1 * | 10/2002 | Stephany et al. ........... 348/372 |
| 6,466,744 B1 * | 10/2002 | Hosaka et al. .............. 396/155 |
| 6,473,570 B2 * | 10/2002 | Ito .............................. 396/542 |
| 2002/0164163 A1 | 11/2002 | Katsura et al. ............. 396/159 |
| 2003/0198467 A1 * | 10/2003 | Costable ..................... 396/535 |

FOREIGN PATENT DOCUMENTS

| JP | 330928 | 5/2000 |
| JP | 209095 A | 8/2001 |
| JP | 228512 A | 8/2001 |
| WO | WO 95/34988 | 12/1995 |

* cited by examiner

Primary Examiner—Judy Nguyen
Assistant Examiner—Rochelle Blackman
(74) Attorney, Agent, or Firm—Roland R. Schindler, II

(57) ABSTRACT

In one aspect of the present invention, camera electrical system is provided for use in a family of recyclable cameras each camera having a set of desired electronic functions. The camera electrical system has a first electronic circuit for performing a first set of electronic operations including charging a flash capacitor and discharging the flash capacitor through a flash tube to cause a flash of light during photography; said first electronic circuit having a first set of electrical contacts. More than one second electronic circuit is provided. Each second circuit has contacts to engage at least one of the first set of electrical contacts, wherein the first electronic circuit and each of said second electronic circuits are adapted to cooperate in a combined circuit comprising the first electronic circuit and more than one of said second circuits to perform the set of desired camera functions.

28 Claims, 13 Drawing Sheets

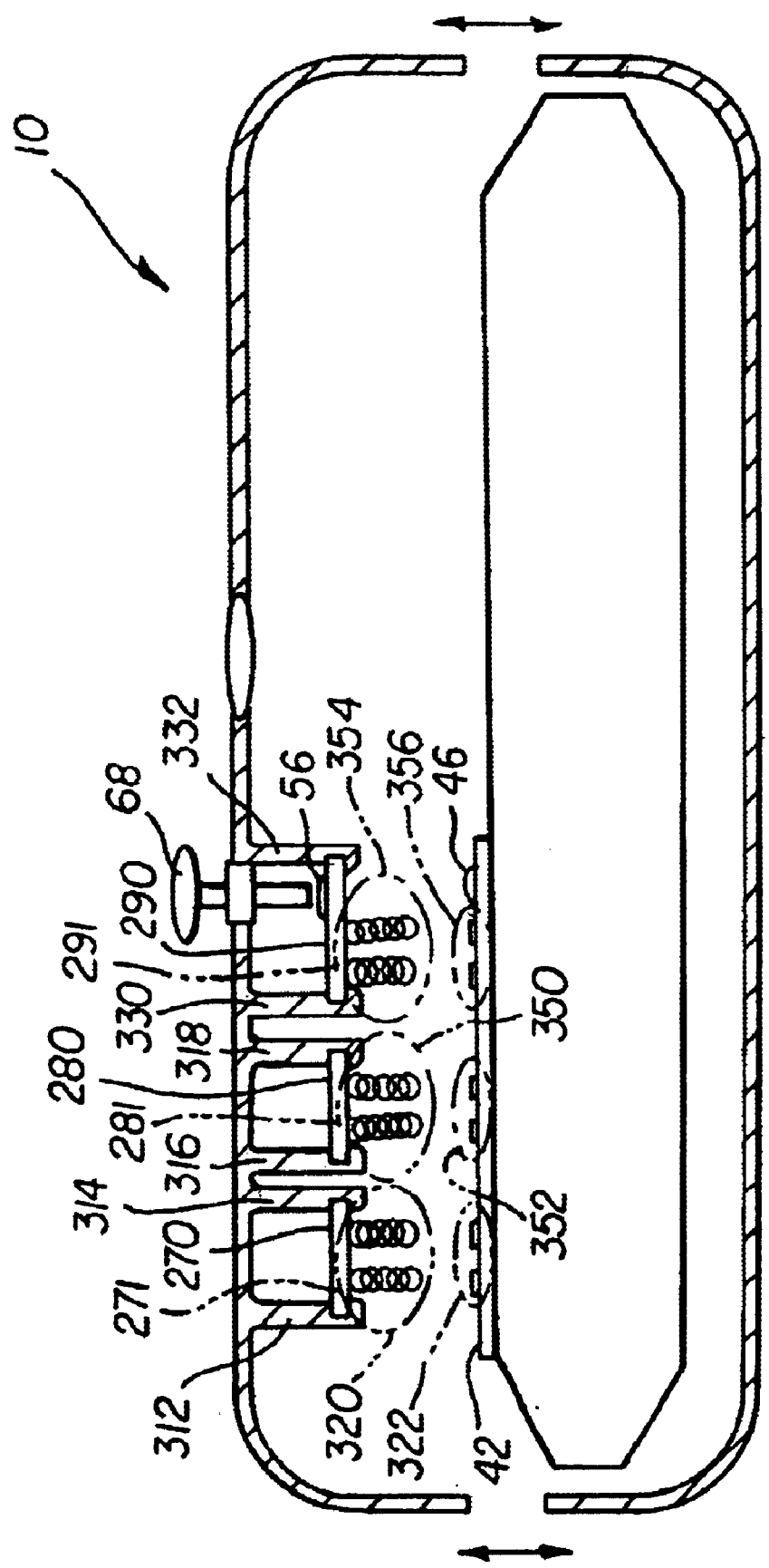

RECYCLABLE CAMERA AND METHOD FOR ASSEMBLING SAME

CROSS REFERENCE TO RELATED APPLICATIONS

Cross reference to related application Ser. No. 10/033,482 entitled CAMERA ELECTRONIC SYSTEM AND METHOD OF ASSEMBLING SAME filed in the name of Douglas W. Constable on Dec. 27, 2001.

FIELD OF THE INVENTION

The present invention relates to the field of recyclable photographic cameras and more particularly to recyclable cameras that incorporate electronic circuits.

BACKGROUND OF THE INVENTION

One time use cameras of the type that are pre-loaded with film, used once by a purchaser, and returned to a photofinisher for processing of the film are becoming increasingly popular with photographers. Principal reasons for this popularity include the low cost and high quality of the images captured using these cameras. One reason that one time use cameras can be sold at low cost is that many of the components used in one time use cameras are recycled by the manufacturer after a purchaser has completed exposing the pre-loaded film and turned the camera over to a photofinisher for development of the film. See for instance, Sakai, et al. U.S. Pat. No. 5,329,330. Therefore, many components of the one time use cameras are designed to last through a suitable number of cycles of sale, use, reconstruction, and resale.

With the increasing popularity of recyclable cameras, consumers have indicated a desire for recyclable cameras having a wider variety of features. In particular, consumers have shown an interest in, for example, features such as camera flash and the ability to record metadata on the film or in association with the film. Such features, in turn, require that one time use cameras have camera electronic systems that execute a set of functions necessary to perform the features. As a result, different types of camera electronic systems have been developed, with each different type performing a different set of functions.

Camera electronic systems however are a relatively expensive component of one time use cameras. Thus, it is important that camera electronic systems are readily recyclable. However as the number of different types of camera electronic systems introduced by a manufacturer increases, the ability of the manufacturer to distribute the development costs for each type of camera electronic system proportionately decreases. This causes a net increase in the per unit cost of each type of camera electronic system. Further, different types of camera electronic systems are typically not compatible with the other types. This increases logistical problems during recycling making the recycling process more complex and expensive which, in turn, also causes a net increase in the cost of such cameras.

Thus, what is needed is a low cost camera electronic system that can be used in more than one different type of one time use camera.

In the electronics industry, it is known to provide circuit boards that contain all of the components necessary to cause the circuit board to perform at least two different functions. Such boards often provide jumper sites br selectable Dual In-line Package pins to allow a manufacturer, user, or other serviceperson to select the mode operation of the board by selectably positioning jumpers or selecting particular Dual In-line Package pins. Often, such circuit boards incorporate all of the componentry necessary to perform both functions. In such an embodiment, the base circuit board must also provide jumper sites with properly positioned jumpers and/or an additional selectable Dual In-line Package pin structure. This adds cost, size, weight and complexity to the circuit board Further, this creates potential quality problems in that improper jumper alignment or improper DIP pin settings are easily overlooked during recycling.

Alternatively, it is known in the art to provide a circuit board having at least one frangible portion with circuit traces passing through the frangible portion. The operation of the circuit board is altered by breaking off the frangible portions so that selected circuit traces are interrupted causing the circuit board to operate in a different way. However, here too, the circuit board must provide all of the componentry necessary to perform more than one set of camera features. Further, it is time consuming and expensive to replace the frangible portion during recycling.

In the electronics industry, it is also known to mechanically rework printed circuit boards by removing conductive traces from the circuit board and soldering wires to remaining traces to form new circuit patterns. It will be appreciated that this is a costly and time-consuming way to perform recycling. U.S. Pat. No. 4,438,561 shows a method of reworking a circuit board by adhering a flexible circuit having a nonconductive substrate to the circuit board. The non-conductive substrate has a circuit trace which acts as a jumper and joins two portions of a circuit together. This alters the underlying circuit system of the printed circuit board permitting the combined circuit board to operate in an altered manner. However, this method is directed at the problem of performing a single rework or repair to the circuit board. This does not address the problem of removing the flexible circuit from the non-conductive substrate and does not provide a cost efficient mechanism to recycle the printed circuit board.

Thus, what is needed, is a low cost camera electronic system of a first type that is readily modifiable to perform functions that are associated with a second type.

One approach for meeting this need is used by circuit boards that have a first circuit having a basic functionality to which additional circuits can be joined in order to add functionality to the first circuit. Examples of this include Japanese Patent Application 2001-228412A entitled "Strobe Unit and Its Manufacturing Method" and Japanese Patent Application 2001-209095A entitled "Strobe Unit and Its Manufacturing Method". Each of these patent applications show a camera flash circuit board having a first circuit with a power supply, a voltage step up circuit, and a flash circuit to start the flash of a flash tube. Each of these circuit boards is also adapted with mountings and appropriate electrical circuitry to permit the boards to be combined with a second circuit member to add additional functionality to the first circuit. In each of these patent applications, the second circuit member is joined to the circuit board and thereby combined with the first circuit board to perform additional functions such as detecting the brightness of a scene in order to disable a flash, to quench a flash and/or to enhance the brightness of a flash.

In each of the '412 and '095 references, the first circuit is physically joined to the second circuit in a manner that prevents separation. The combined circuits are installed into the camera. During recycling, the first and second circuit boards must be physically separated. This joining and separating requires additional labor during the manufacturing and recycling processes. Further, this joining and separating can cause physical damage to the components of either the first circuit board or the second circuit board. Thus, what is needed is a method for assembling and recycling a camera that combines two or more electronic circuits in a way that reduces the labor and risk of damage incident to the joining of the first and second circuits while ensuring that the circuits stay in joined relationship during the life cycle of the one time use camera. What is also needed is a method for assembling and recycling the camera that reduces the amount of labor and the risk of damage that is incident with the separation of the circuit boards.

It will also be appreciated that during the recycling process, it is necessary to provide positive assurance that the camera system is operating as a camera of the first type or a camera of the second type. Thus, what is also needed is a camera system having a second circuit, the presence of which is easily detectable after manufacture by testing or quality assurance monitoring equipment.

Finally what is desired is a method for assembling and recycling cameras that minimizes the cost of the camera and of assembling and recycling the camera

SUMMARY OF THE INVENTION

In one aspect of the present invention, a camera is provided having a first electronic circuit board with first electronic circuit to perform a first set of camera functions. The first electronic circuit has a first set of electrical contacts. A second electronic circuit board is also provided. The second electronic circuit board has a second electronic circuit with a second set of electrical contacts to engage the first set of electrical contacts. The second electronic circuit is defined to cooperate with first electronic circuit to perform a second set of camera functions when the second set of electrical contacts engage the first set of electrical contacts. A frame holds the first electronic circuit board. A cover joinable to the frame is provided. A mounting is also provided for holding the second electronic circuit board and positioning the second set of electrical contacts so that when the cover is joined to the frame the second set of electrical contacts are positioned to engage the first set of electrical contacts to cause the first electronic circuit board to cooperate with the second electronic circuit to perform the second set of camera functions.

In another aspect of the present invention, a camera having a cover is provided. A drive member is mounted to the cover and movable between a first position and a second position. A first electronic circuit board having a first electronic circuit that performs at least one of a first set of camera functions in response to movement of the drive member into the second position is also provided. A second electronic circuit board having a second electronic circuit that combines with the first electronic circuit to cause the combined circuit to perform a second set of camera functions is also provided. A mounting positions the second electronic circuit board between the drive member and the first electronic circuit, with the second electronic circuit positioned to block movement of the drive member at a third position and prevent movement of the drive member into the second position.

BRIEF DESCRIPTION OF THE DRAWINGS

FIG. 11 shows one embodiment of a camera that receives a second circuit formed from modular components.

DETAILED DESCRIPTION OF THE INVENTION

Figure 1:
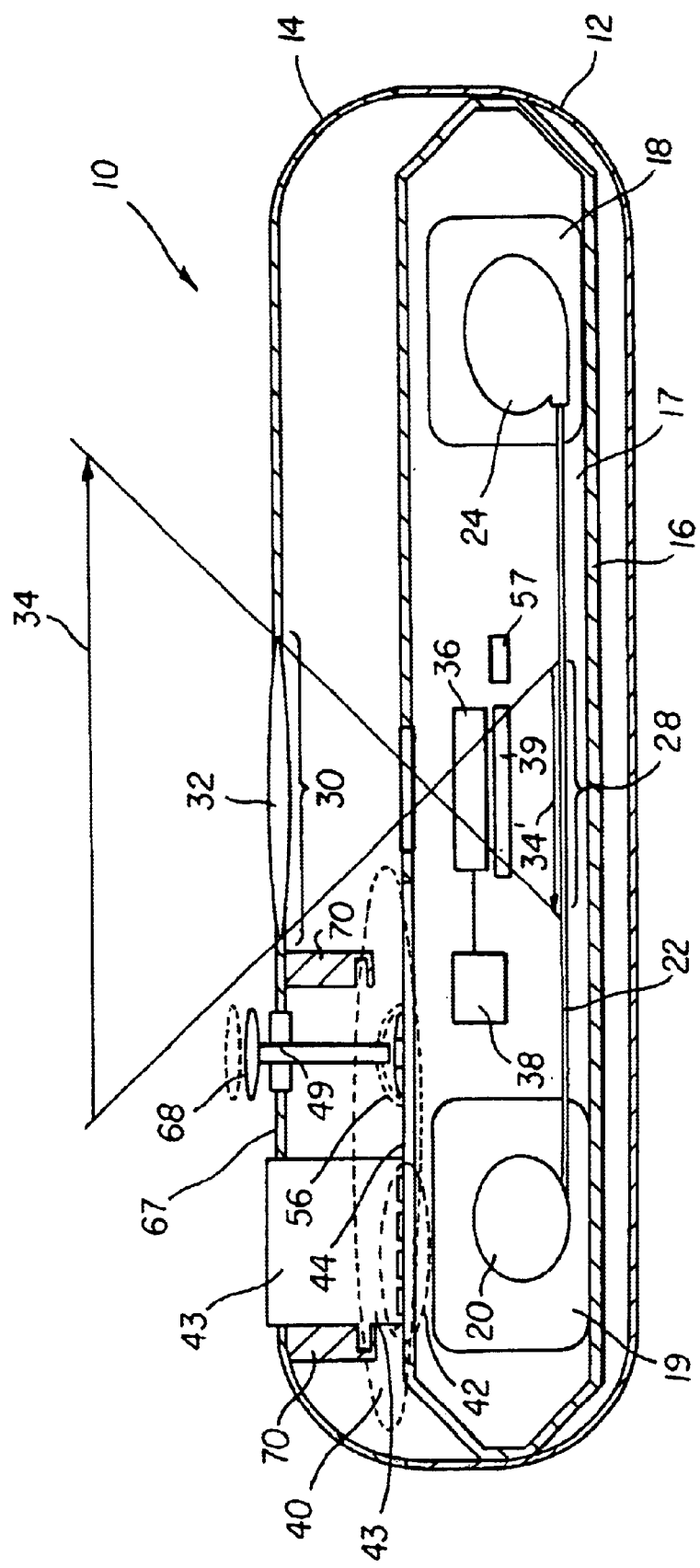
FIG. 1 shows a cross-section schematic diagram of an embodiment of a camera having a first electronic circuit and cover of the present invention.

Turning now to FIG. 1 what is shown is a diagram of an embodiment of a recyclable camera system 10 of the present invention. As shown in FIG. 1, recyclable camera system 10 has a first cover 12 and a second cover 14. A frame 16 is disposed between first cover 12 and second cover 14. Frame 16 can be a component that is separate to from but joined to first cover 12. Alternatively, frame 16 can be formed in whole or in part by features of first cover 12. In the embodiment shown, frame 16 supports a film path 17 having a film take up reel area 18, a film supply spool area 19, a film supply spool 20 and a film take up reel 24.

When camera 10 is manufactured or recycled, a length of film 22 is stored on supply spool 20. Take-up reel 24 is revolved by a winding mechanism (not shown) to draw film 22 from film supply spool 20 and onto film take-up reel 24. Disposed between supply spool 20 and take-up reel 24 is an image capture area 28. Second cover 14 has an opening 30 aligned with image capture area 28. Lens 32 is disposed in opening 30 to focus light from a scene 34 to form an image 34' on film 22. Shutter system 36 is disposed between lens 32 and unexposed film 22 to control the amount of light to which film 22 is exposed during image capture.

An image is captured on film 22 when the camera user presses shutter release 38. Shutter release 38 causes shutter system 36 to move a shutter blade 39 from a position that blocks light from passing from lens 32 to film 22, to a position permitting light to pass from lens 32 to film 22.

Typically, shutter system 36 stays in a position that allows light to pass for a predetermined period of time. After this predetermined period of time has passed, shutter system 36 returns to the blocking position thus completing the exposure cycle.

Figure 2:
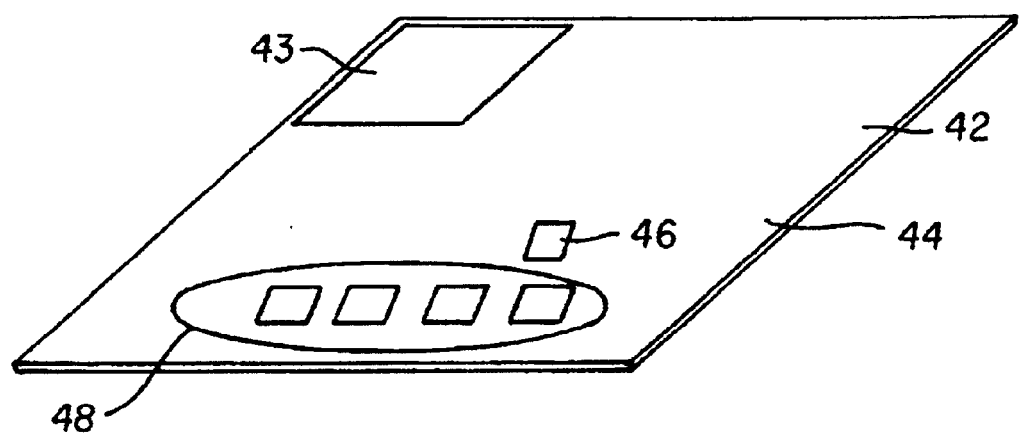
FIG. 2 shows a diagram of an embodiment of a camera wiring board having a first electronic circuit for performing a first set of camera functions for use in a camera electronic system of the present invention.

As is shown in FIG. 1, camera 10 incorporates a camera electronic system 40. A diagram of one embodiment of camera electronic system 40 is shown in FIG. 2. Camera electronic system 40 comprises a wiring board 42 having a first electronic circuit 44. In the embodiment shown, first electronic circuit 44 performs primary camera flash functions: flash capacitor charging and flash tube discharge. A dome switch 46 is shown in first electronic circuit 44. The dome switch 46 causes flash capacitor charging to begin in first primary camera flash circuit 44. Dome switch 46 must be held closed until flash charging is completed. A driving member 47 is used to permit a user of camera 10 to depress dome switch 46. An example of driving member 47 is shown in FIG. 1 which depicts driving member 47 which projects through an opening 49 in first cover 14 to engage dome switch 46 and permit a user of camera 10 to enable the first electronic circuit 44. Wiring board 42 with first electronic circuit 44 have "press and hold" functionality. That is, the user of camera 10 presses and holds down the driving member 68 until the flash capacitor is charged. This charge is discharged during an exposure cycle. The discharge is triggered by a sync switch 57 which closes in response to movement of shutter blade 39.

Figure 3:
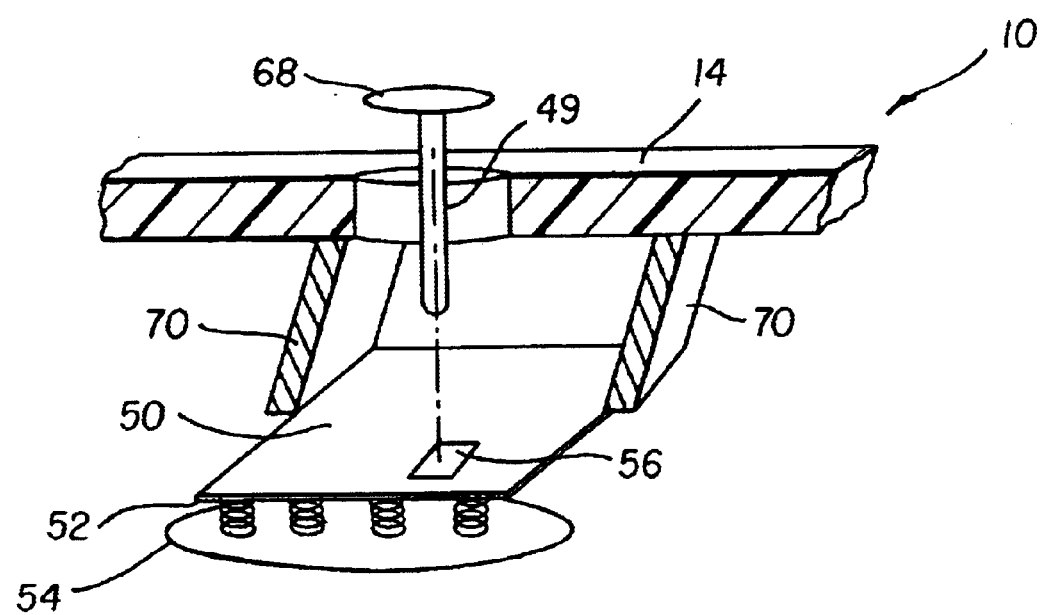
FIG. 3 shows a diagram of an embodiment of a second wiring board located in a mounting of a camera cover for engagement with the first circuit

As is shown in FIG. 2, first camera electronic circuit 44 also comprises a first set of electrical contacts 48 which are adapted to mate with a second electronic circuit 50 shown in FIG. 3. As is shown in FIG. 3, second electronic circuit 50 is located on a second circuit board 52 and provides a second set of electrical contacts 54. In the embodiment shown, the second set of electrical contacts 54 comprise resilient compression springs. Alternatively, other resilient conductors such as brushes or levers can be used. Although not preferred, solid connectors such as rods and pins can also be used When an electrical connection is made between the first set of electrical connectors 48 and the second set of electrical connectors 54, a combination electronic circuit is created that is capable of performing a second set of camera functions.

Typically, the second set of camera functions is more complex than the first set of camera functions and the second electronic circuit 50 provides additional components and circuitry necessary for the execution of the more complex second set of functions. The second set of functions can be related to the first set of functions such as where first electronic circuit 44 provides a camera flash feature and the combination of the first electronic circuit 44 with the second electronic circuit 50 provides a flash feature having a so called "one touch flash charging circuit". In a one touch flash charging circuit, the user of camera 10 needs only to depress the driving member 47 once to cause a full measure of flash charge to be stored in the first electronic circuit 44. Also in the combination circuit, charging continues for a period of time after full charge is reached, the charging is then automatically stopped after this period of time.

The second set of functions can also be unrelated to the first set of camera functions. This can occur, for example, where first circuit board 42 provides a first electrical circuit 44 that performs a default set of camera functions necessary to provide an electronic flash feature while second electronic circuit 50 provides, for example, audio capture circuitry.

Further, the second set of camera functions does not necessarily need to be more complex then the first set of camera functions, as it may occur that the second set of camera functions is less complex but requires a more costly electrical circuit structure than that which is provided for on camera wiring board 42. In such a circumstance, the second driving circuit 50 provides the electrical circuit structure necessary to cooperate with the first electronic circuit 44 to perform the less complex feature set.

By using such a camera electronic system 40, a family of different one time use cameras 10 can be developed that incorporate first circuit board 42. This common use of first circuit board 42 reduces the development costs and cost of recycling each camera 10 in the family.

However, it is important to the recyclability of the camera electronic system 40 that first electronic circuit 44 and second electronic circuit 50 can be combined and separated with a minimum of extra effort and expense. Further, it is important that first electronic circuit 44 and second electronic circuit 50 are joined together so that the first set of electrical contacts 48 can separate from the second set of electrical contacts 54 during recycling without substantial risk of damage to first circuit board 42, first electronic circuit 44, second electronic circuit 50 and second circuit board 52.

In the embodiment shown in FIGS. 1 and 2, camera 10 contains first circuit board 42 having a first electronic circuit 44 for generating a flash of light to provide supplemental illumination to a photographic scene as generally described above. Thus, in this embodiment, the first set of camera functions includes camera flash charging and camera flash discharge. First circuit board 42 is shown fixed to camera frame 16 and arranged thereon so that the first set of contacts 48 are confrontingly aligned with mounting 70 that extends from second cover 12.

Figure 4:
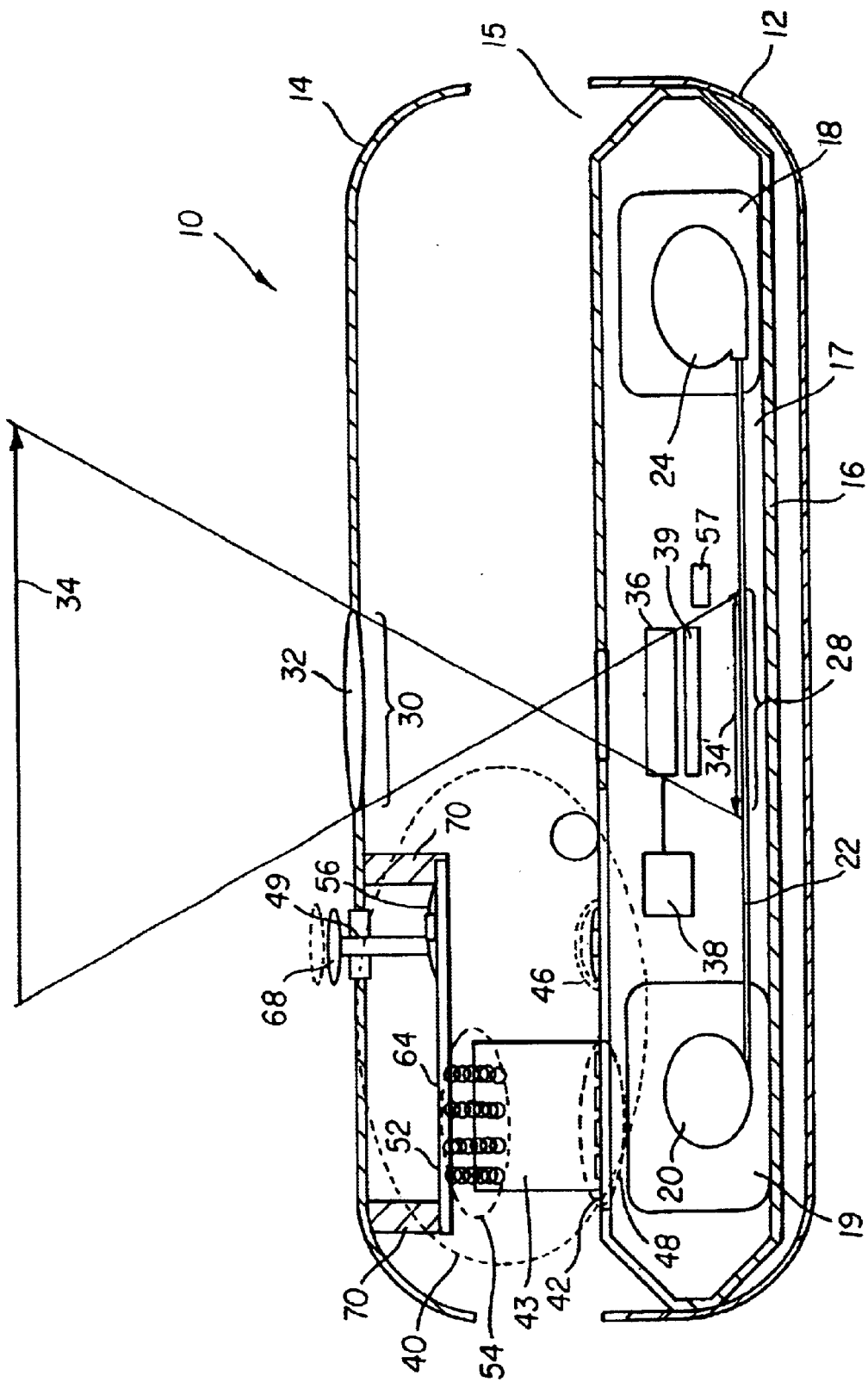
FIG. 4 shows an assembly view of the camera of FIGS. 1–3.
Figure 5:
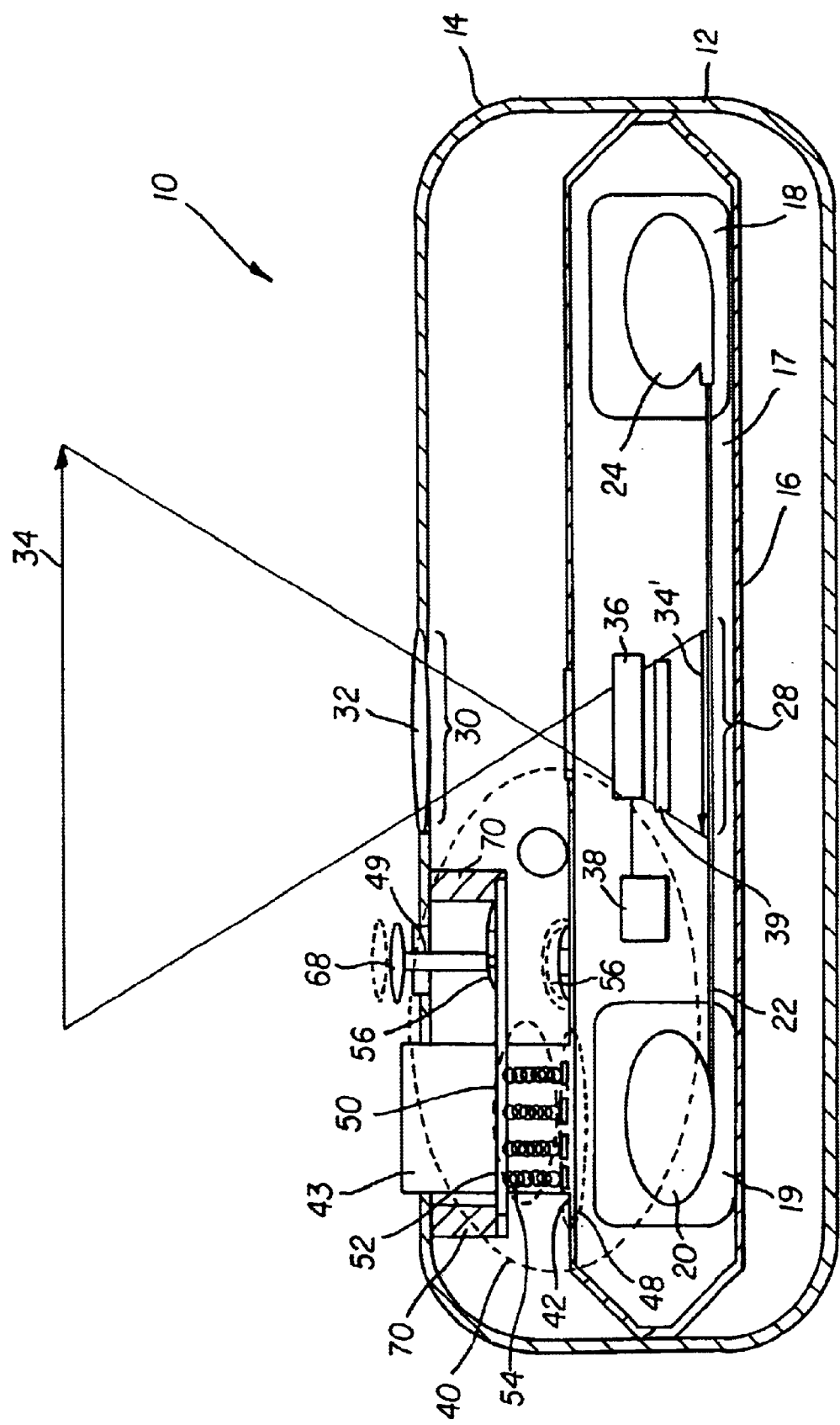
FIG. 5 shows an assembled view of the camera of FIGS. 1–3.

The engagement of first electronic circuit 44 to second electronic circuit 50 in camera 10 will now be described with reference to FIGS. 2–5. FIGS. 2 and 3 show a diagrammatic view of the relationship between first electronic circuit 44, driving member 68 and second electronic circuit 50. FIG. 4 shows a perspective assembly view of camera 10 of FIG. 1 having the second electronic circuit 50 mounted on a second circuit board 52 while FIG. 5 shows camera 10 in an assembled form. As is shown in FIGS. 2–5 second circuit board 52 is held by mounting 70. In the embodiment shown, mounting 70 extends from second cover 14 and holds second circuit board 52 so that the first set of electrical contacts 48 is aligned with the second set of electrical contacts 54 as second cover 14 is joined to first cover 12. As is shown in FIG. 5, when first cover 12 is assembled to second cover 14 the first set of electrical contacts 48 and the second set of electrical contacts 54 are electrically joined. It will be appreciated that by using second cover 14 and mounting 70 to position and hold the second set of electrical contacts 54 in electrical contact with first set of electrical contacts 48, first electronic circuit 44 can be joined to second electronic circuit 50 in order to achieve the electrical engagement necessary to permit the first electronic circuit 44 and the second electronic circuit 50 to cooperate to perform the second set of functions. This substantially reduces the possibility that first electronic circuit 44 or second electronic circuit 50 will be damaged by the process of mechanically joining or separating the electrical circuits.

Further, it will be appreciated that in the embodiment shown in FIGS. 1–5, mounting 70 slidably receives and holds second circuit board 52. Thus, during recycling and manufacture, second circuit board 52 can be installed and removed from second cover 14 in a simple manner. This also greatly simplifies the process of modifying the set of camera functions that camera 10 performs.

As is also shown in FIGS. 2–5, second electronic circuit 50 and second circuit board 52 are arranged to cooperate with driving member 68. In this regard, FIGS. 4 and 5 show a switch 56 disposed in the path of driving member 68 which allows second electronic circuit 54 to operate in response to movement of driving member 68. For example, as described above, where first electronic circuit 44 provides a flash circuit having press and hold functionality, flash energy is stored only when driving member 68 depresses dome switch 46. However, when second electronic circuit 50 engages first electronic circuit 44, a full charge of flash energy is stored in response to only one momentary depression of driving member 68 in order to provide a feature known as "one touch" flash charging. In this way, the function of the camera 10 can be changed by the insertion of second circuit board 52. More importantly, second cover 14 and driving member 68 can be used by a camera 10 which may or may not have a second wiring board 52.

It will further be appreciated that to reduce the cost of first circuit board 42, or for other reasons, first circuit board 42 and first electronic circuit 44 can be defined in such a manner that activation of certain functions of the first electronic circuit 44 interferes with the performance of the second set of camera functions. This can happen where, for example, one or more of the 7 second set of camera functions is incompatible with the one or more of the first set of camera functions. Under such circumstances it is necessary to prevent the first electronic circuit 44 from performing the interfering functions. In the embodiment shown in FIGS. 2–6, the driving member 68 is disabled mechanically by interposing second circuit board 52 in the path of travel of driving member 68. This prevents driving member 68 from engaging dome switch 46 which in turn, prevents first electronic circuit 44 from being operative in a manner that interferes with the performance of the second set of camera functions. Similarly, it will be appreciated that second circuit board 52 can also be used to interfere with the passage of light and other environmental conditions that can cause other detectors (not shown) of first election circuit to interfere with the performance of the second set of camera functions.

Figure 6:
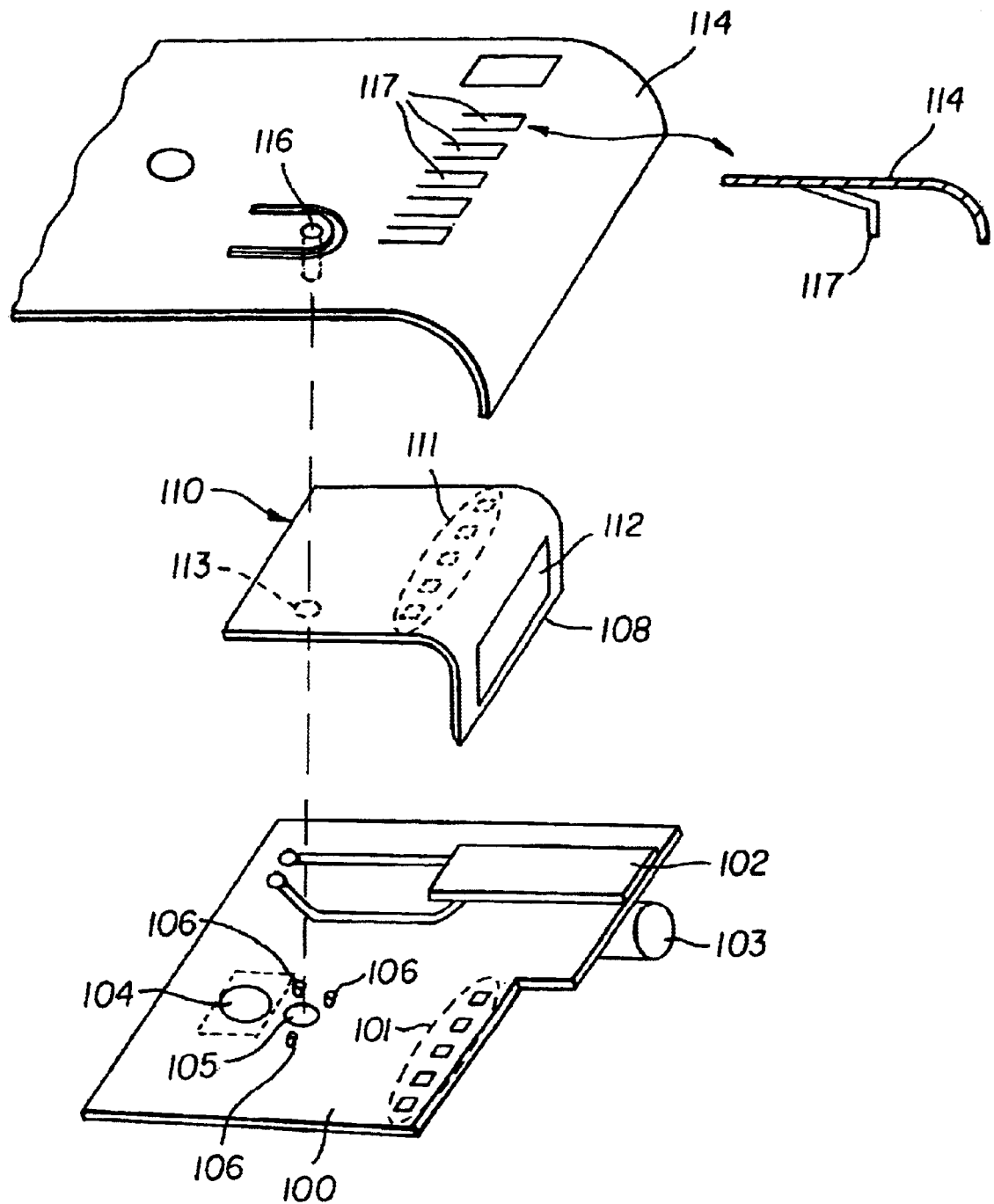
FIG. 6 shows an embodiment of the present invention wherein a flex circuit is used.

FIG. 6 shows a diagram of another embodiment of the present invention wherein a first electronic circuit board 100 is shown. In this embodiment, first electronic circuit board 100 has a first electronic circuit 106 that performs the function of charging a flash capacitor 103 in a press and hold manner. First electronic circuit 106 also performs the function of discharging stored electrical energy from flash capacitor 103 to cause a flash of light to emit from flash tube 102. First electronic circuit 106 has a switch 104 which must be depressed continuously for flash capacitor charging to take place.

A second electronic circuit 108 is shown supported by a flexible base 110. Second electronic circuit 108 has contacts 111 which are designed to mate with a first set of contacts 101 of the first electronic circuit 106. As is shown in FIG. 6, cover 114 defines a plurality of clamps 117 to engage contacts 111 to provide mechanical pressure against contacts 101. Clamps 117 apply sufficient pressure to hold first circuit board 100 to second circuit board 108.

When contacts 111 of the second electronic circuit 108 mate with contacts 101 of first electronic circuit 106 the first electronic circuit 106 and second electronic circuit 108 combine to perform a second set of camera functions. In the embodiment that is shown, the second set of camera functions includes one touch charging of the flash capacitor 103. In this regard, second electronic circuit provides a one touch circuit contact 113 that is actuated to trigger one touch charging.

One touch circuit contact 113 is actuated when it mates with a matching contact 105 on the first circuit board 100. The matching contact 10 is separated from the location of the switch 104 on the first circuit board 100. Three plastic pegs 106 are shown projecting through primary circuit board 100 in the area of switch contact 105. These prevent contact 113 from making contact with contact 105 unless pressure is applied to flexible circuit in the area of contact 113. In the embodiment shown, appropriate pressure is applied by way of lever 116. Lever 116 is positioned by cover 110 to engage contact 113. In the embodiment shown, lever 116 is not positioned to engage switch 104, thus, the functionality of switch 104 is disabled. In this regard, two different covers can be used. A first type of cover 14 engages switch 104 and is used when it is desired to cause camera 10 to perform the first set of camera functions. A second type of cover 14 engages the switch formed by contacts 105 and 113 and is used it is desired to cause camera 10 to perform the second set of functions and where a second electronic circuit 108 is provided. Alternatively a single cover 14 can be provided having two levers one adapted to engage switch 104 and another adapted to engage the switch formed by contacts 105 and 113.

Figure 7:
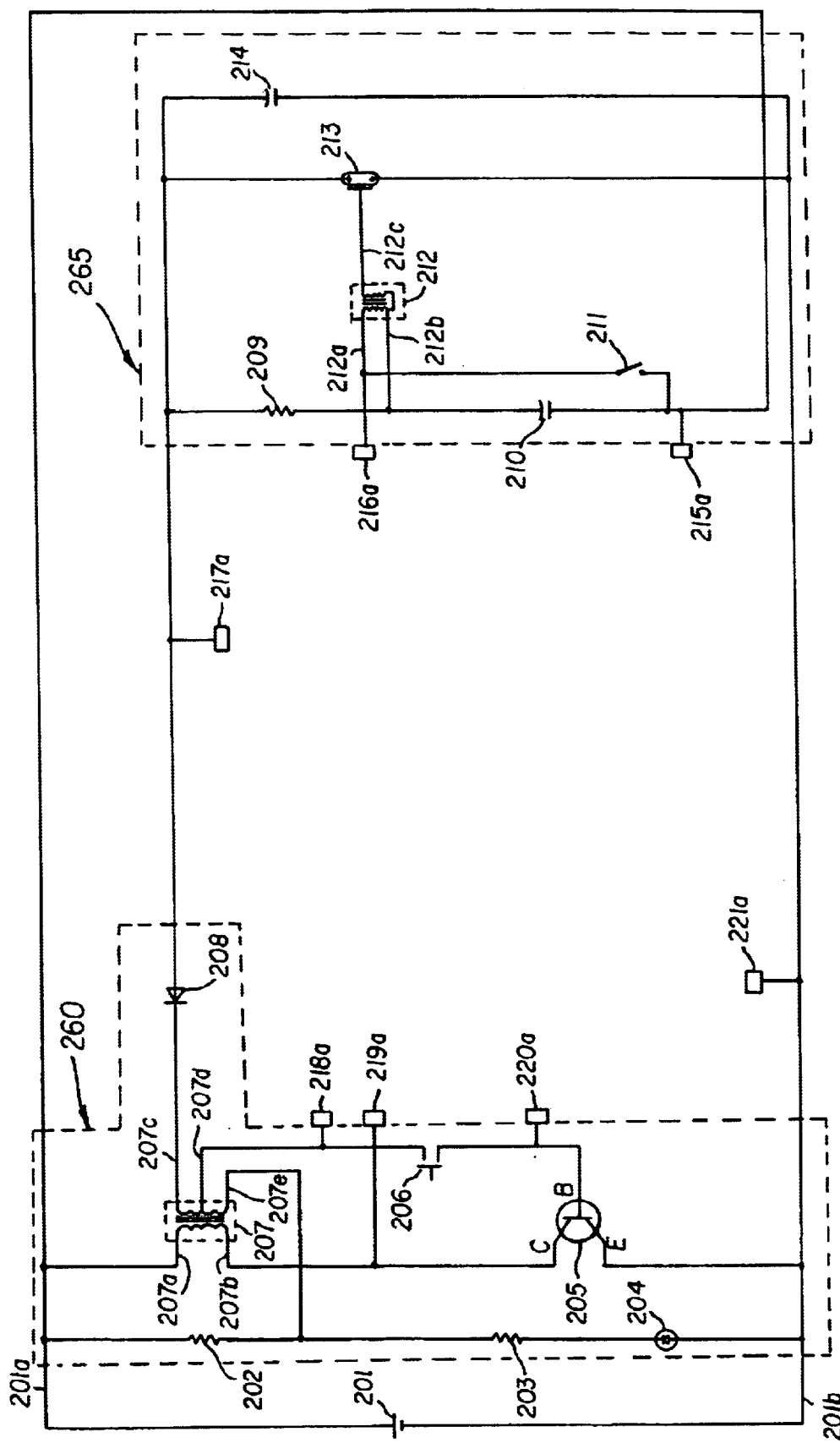
FIG. 7 shows one embodiment of a first circuit for performing a first set of camera functions and having contacts.

FIG. 7 shows a detailed embodiment of a first electronic circuit 42 having a flash circuit 200 for use in providing a press and hold type camera flash. Flash circuit 200 incorporates a power source 201, for example, a battery such as one 1.6 volt cell. The flash circuit 200 includes a self-oscillating flash charging circuit 260, and a flash illumination circuit 265. Flash charging circuit 260 comprises an oscillating transistor 205, step-up oscillating transformer 207, rectifier diode 208, LED ready light 204. A manually operated, normally open push button switch, 206, is operated by, for example, a driving member 68 passing through a port 69 in second cover 14 as is generally described above. When closed, switch 206 causes flash charging circuit 260 to store electrical energy in a flash energy capacitor 214. The customer presses switch 206 and holds it closed until the LED ready light 204 illuminates to indicate that flash capacitor 214 is charged to flash ready voltage. The customer then repeats this procedure for the next picture.

Flash illumination circuit 265 comprises trigger capacitor 210, shutter sync switch 211, trigger transformer 212, flashtube 213, and flash energy capacitor 214. Shutter sync switch 211 typically is interconnected with camera shutter mechanism 36 so as to be closed momentarily when the shutter mechanism is opened by pressing the camera shutter release 38. The closure of shutter sync switch 211 enables flash energy to be discharged from flash energy capacitor 214 into flash tube 213 causing a flash of light to emit from tube 213.

Also shown in FIG. 7 are contacts 215a–221a. These contacts provide electrical connection points at strategic locations within the flash circuit 200. As discussed above, contacts 215a–221a are provided so that they can be engaged by a second electronic circuit, shown in this embodiment as 252 to cause the combined flash circuit 200 and second electronic circuit 252 to perform a desired set of functions.

Figure 8:
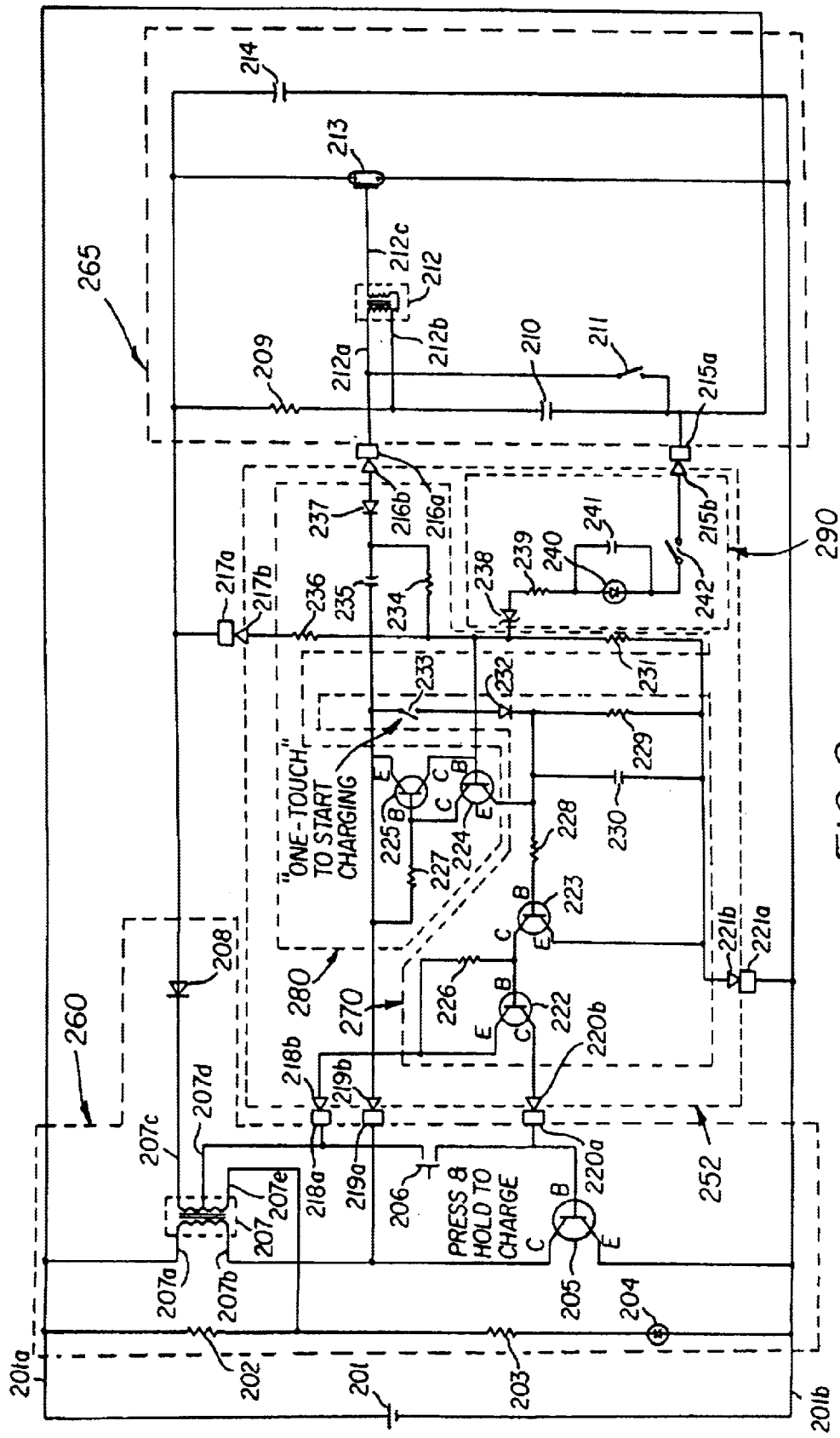
FIG. 8 shows an embodiment of a first circuit with one embodiment of a second circuit that cooperates with the first circuit to a second set of camera functions.

The embodiment of FIG. 8 shows an embodiment of second electronic circuit 252 having second contacts 215b–221b that engage respectively contacts 215a–221a to interconnect the operation of flash circuit 200 and second electronic circuit 252. Second electronic circuit 252 contains a timeout circuit 270, an auto-restart circuit 280 and a fatbit recording circuit 290. Timeout circuit 270 includes transistors 222 and 223, timing capacitor 230 and "one-touch" push button switch 233 and diode 232. Auto-restart circuit 280 includes transistors 224, 225, diode 237 and capacitor 235. Fatbit recording circuit 290 includes fatbit recording LED 240, fatbit selection switch 242, zener diode 238 and capacitor 241.

Referring now to FIG. 8 the operation of the flash circuit 200 in conjunction with second driving circuit 252 will be described. It will be recalled that flash circuit 200 operates in the "press and hold" mode when switch 206 is closed. This switch must be functionally disabled in order to permit flash circuit 200 to operate in a different manner. As has been described in greater detail above, in accordance with an embodiment of the present invention, second electronic circuit 252 is deposited on a second wiring board such as second wiring board 52 shown in FIG. 3. This second wiring board is physically interposed between driving member 68 and switch 206. This prevents driving member 68 from closing switch 206 preventing flash circuit 200 from operating in the press and hold mode. Advantageously, "one-touch" push button switch 233 can be disposed on second wiring board 52 in the path of travel of driving member 68.

Thus, driving member 68 can be used to cause flash circuit 200 to activate the "press and hold mode" when second electronic circuit 252 is not present or to cause second electronic circuit 252 to enter the "one touch" mode when second electronic circuit 252 is present.

When switch 233 on module 252 is pressed a forward bias is applied to diode 232 and transistors 223 and 222. This turns transistor 222 and 223 on. With transistor 222 turned on, current flows from the battery (201a) through resistor 202 to transformer 207 feedback winding 207e-d to transistor 222 emitter-collector to the base of transistor 205. Thus transistor 205 turns on and conducts battery current through the primary (207a-b) of transformer 207, initiating oscillatory pulses through prima winding 207a-b. The voltage of these pulses is stepped up in the secondary winding 207c-d and rectified by diode 209 to charge main flash capacitor 214. Diode 232 rectifies pulses from the primary winding 207b to continue charging timing capacitor 230 while switch 233 is closed. Typically, timing capacitor 230 is charged in about 10 milliseconds and discharges over 30 seconds. The flash capacitor 214 charges to flash ready voltage in about 5 seconds.

The DC bias to continue the oscillation and thus continue flash charging after switch 233 is open is provided by timing capacitor 230, which charges positive when switch 233 is closed. When switch 233 opens, capacitor 230 slowly discharges through resistor 228 and the base-emitter of transistor 223, keeping 223 and 222 turned on for about 30 seconds. This, in turn, keeps the oscillation on for this period. Resistor 229 insures that capacitor 230 will eventually discharge completely, thus insuing that the charging will turn off after the timeout period A light emitting diode (LED) ready light is connected from the transformer 207 feedback winding 207e to battery negative 201b. As the flash capacitor 214 charges and increases its voltage, the voltage of the pulses at feedback winding 207e simultaneously increase in proportion to the flash capacitor 214 voltage. The transformer winding ratio of 207c-d to 207d-e is chosen so that when flash capacitor 214 reaches flash ready voltage (about 270 volts), the LED 204 will illuminate and indicate that the camera is ready to take a flash picture.

Trigger capacitor 210 is charged by current flow through secondary winding 207cd at the same time and in similar manner as flash capacitor 214. When sync switch 211 is closed at the start of a picture taking sequence, terminal 212a of trigger transformer 212, which is at the negative charge potential of flash capacitor 214, is pulled momentarily to the positive battery potential, 201a. Trigger capacitor 210 then discharges through the primary winding of trigger transformer 212, inducing a very high voltage pulse in the secondary winding 212c, which is applied to the triggering electrode T of flashtube 213. This causes ionization of the gas in the flashtube 213 resulting in flash capacitor 214 discharging through flashtube 213, producing flash illumination. Resistor 209 provides isolation between the flashtube discharge circuit and the flashtube trigger circuit, preventing flash capacitor 214 from discharging into the primary of trigger transformer 212.

The closure of switch 211 also initiates the restart of oscillation in the flash charging circuit 260, automatically recharging flash capacitor 214 for the next picture. Closing switch 211 causes the normally reverse biased diode 237 to become forward biased by the connection of its anode through the closed contacts of switch 211 to the positive battery potential 201a This action draws current through resistor 234 and the base-emitter junction of transistor 224, turning it on. Transistors 224 and 225 have their bases and collectors connected to form a thyristor; hence when 224 is turned on, it in turn turns on 225 and the transistors "lock" keeping each other turned on. Current then flows from primary winding 207b through transistors 224 and 225 to charge timing capacitor 230 and restart the flash charging sequence. Capacitor 235 charges when diode 237 conducts. The charge on capacitor 235 keeps transistors 224 and 225 turned on for a period of time sufficient to charge timing capacitor 230; otherwise transistors 224 and 225 would turn off when sync switch 211 opens and diode 237 stops conducting. Transistors 224 and 225 turn off when the charge on capacitor 235 is depleted and current from this charge no longer forward biases the base of transistor 224 on.

In addition, as the timing capacitor 230 charges, it makes the emitter of transistor 224 more positive with respect to the base, enhancing the turnoff of transistor 224. Resistor 236 couples voltage from the flash capacitor 214 into the base of transistor 224. As the flash capacitor 214 charges, resistor 236 provides an increasing negative bias to the base of transistor 224, further enhancing turn-off of transistors 224 and 225. The turnoff is defined so that the charging of the timing capacitor 230 stops at a predefined fully charged level.

Second electronic circuit 252 also comprises a fatbit recording circuit 290. A fatbit is a term that is used to describe optically recorded metadata that is recorded on a film by a one time use camera. When a fatbit is detected during photofinishing, the photofinisher knows to print the image using, for example, a panoramic aspect ratio, to execute digital zoom or to perform some other type of special image processing procedure. Essentially the fatbit recorder comprises a light emitting diode that exposes a predefined non-image portion of the image recorded on the film.

Fatbit recording circuit 290 works as follows: capacitor 235 is charged during closure of switch 211 and provides positive bias to the base of transistor 224 for a time period greater than the period for which switch 211 is closed, keeping transistors 224 and 225 on for this period. Transistor 225 provides a current path for positive pulses from the oscillation transformer 207b and this becomes the energy source for illuminating fat bit recording LED 240. The illuminating current flows from transistor 225 collector, zener diode 238, current limiting resistor 239, LED 240 and data recording on-off switch 242 to positive battery potential 201a. The voltage of zener diode 238 is chosen so that it will not conduct when switch 233 is closed and thus no data recording will be made when switch 233 is pressed to initiate flash charging.

Data recording will only take place when sync switch 211 is closed during picture taking sequence and when the data recording switch 242 is closed.

Figure 9:
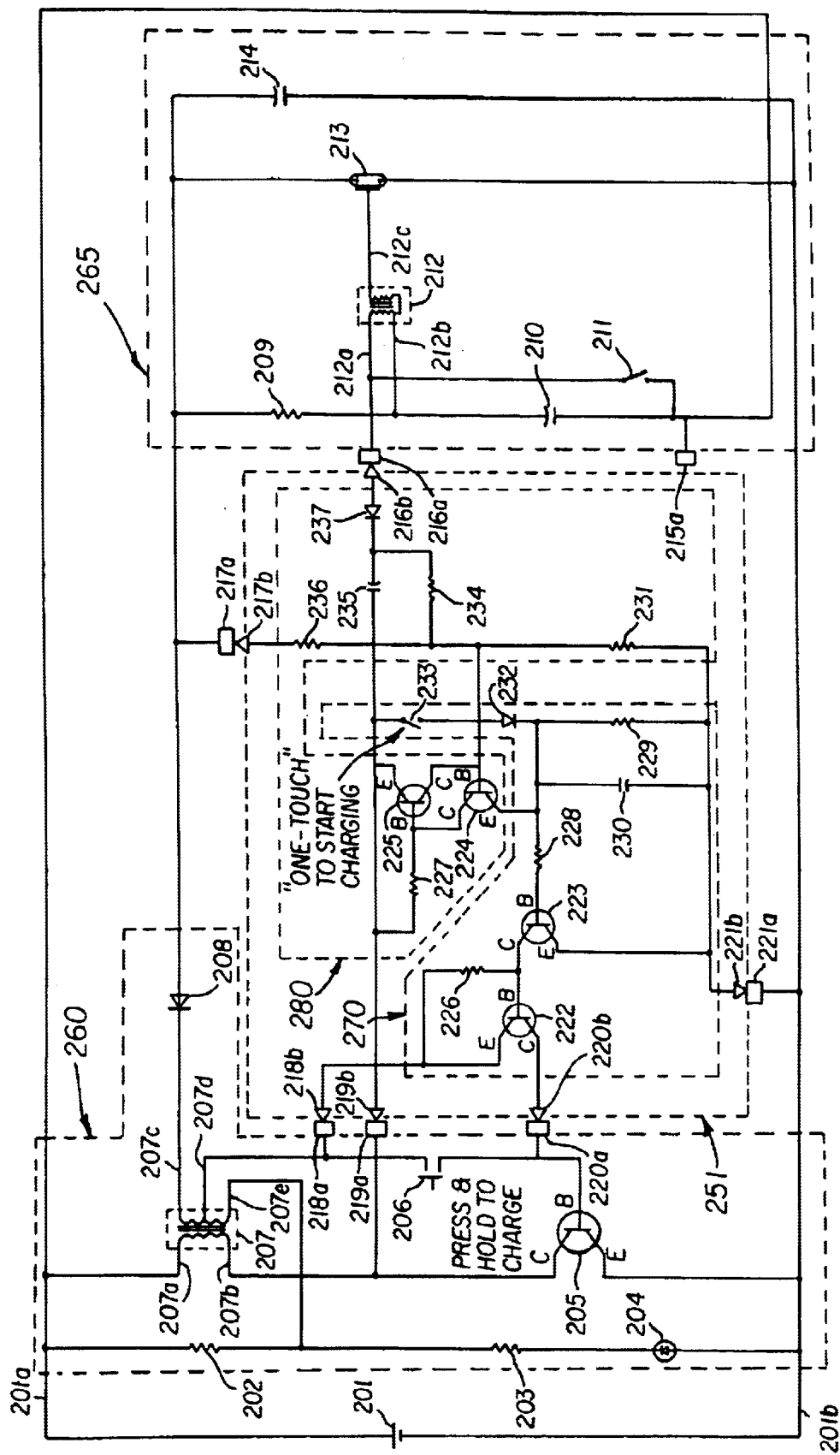
FIG. 9 shows a combination of first circuit of FIG. 7 with another embodiment of a second circuit that cooperates with the first circuit to perform a third set of camera functions.
Figure 10:
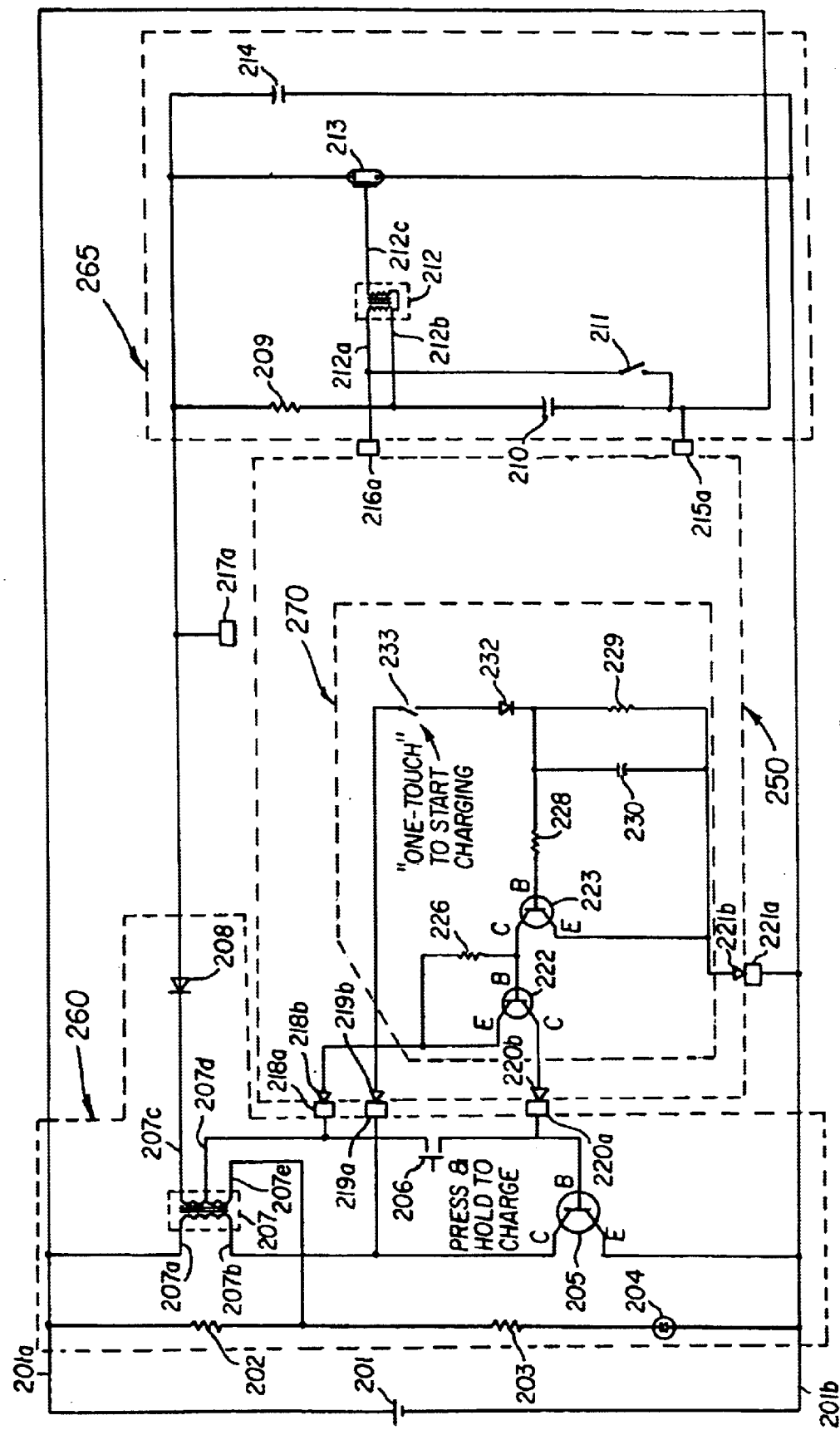
FIG. 10 shows a combination of first circuit of FIG. 7 with still another embodiment of a second circuit that cooperates with the first circuit to perform a fourth set of camera functions.

FIGS. 9 and 10 show alternate embodiments of second electronic circuit 252 that can be used in conjunction with flash charge circuit 200 shown in FIG. 7 to perform, respectively a third set of camera functions and a fourth set of camera functions.

FIG. 9 shows another embodiment of a second electronic circuit 251 for use in a flash camera having one touch charging and that automatically restarts after charging. In this embodiment, flash circuit 200 is combined with a second electronic circuit 251 having a one touch charging circuit, a timeout circuit 270, an auto-restart circuit 280. These circuits combine in the manner described above to provide a circuit that executes one touch charging and that restarts the charging process immediately after a discharge of flash light.

FIG. 10 shows flash circuit 200 in conjunction with still another embodiment of a second electronic circuit 250 which provides "one-touch" operation of the charger. Second electronic circuit 250 is a circuit that converts the operation of the flash charging system so that the user does not have to press and hold the flash charge button in order to permit the charger to charge capacitor 214. Instead, using the circuit by combining the circuit of FIG. 7 with the second electronic circuit 250, a circuit is provided that permits the user to touch the charge button only once to initiate a charge flash cycle, and then permits the user to release that charge button without interrupting the charging process. This combination circuit further is adapted to shut off the charging process when the appropriate charge is placed across charge capacitor 214. The customer presses and immediately releases switch 233 to initiate flash charging for about 30 seconds. The customer repeats this procedure for the next picture.

It will be appreciated from the embodiments of FIGS. 7, 8, 9 and 10, that a second electronic circuit such as 251 having one touch charging, auto restarting and fat bit recording circuits can be formed as a single circuit or it can be formed in a modular fashion with timeout circuit 270, restart circuit 280 and fatbit recording circuit 290 each comprising separable modules resting on separate circuit boards that can be electrically connected to cooperate. Such modules are adapted with contacts to permit them to interact. In this way, additional circuits for performing additional functions can be added to the second electronic circuit board in a manner that minimizes the cost of each additional module. This also allows for greater flexibility in camera design as a greater variety functional combinations can be achieved without requiring a plurality of second electrical circuits with each of the second electrical circuits defined to perform a particular set of second functions.

However, such modules must be joined in a manner that permits their easy assembly and disassembly while still permitting them to be joined to and separated from first electric circuit 250 in the manner described above. FIG. 11 shows an embodiment of camera 10 having a second electronic circuit 306 provided in modular form. In this embodiment, cover 302 has mounting 310 comprising a flexible snaps 312 and 314 for holding, for example, a circuit board 271 having circuit 270 so that contacts 320 of circuit board 271 engage contacts 322 of first circuit board 342. Similarly, flexible snaps 316 and 318 hold, for example, a circuit board 281 having circuit 280 so that contacts 350 engage contacts 352. In addition, flexible snaps 330 and 332 hold, for example, a circuit board 291 having circuit 290 so that contacts 354 engage contacts 356.

It will be appreciated that, in this embodiment, modular circuits can be installed and removed from mounting 310 without necessarily removing all of the modular circuits from mounting 310. For example, in the embodiment shown, a camera manufacturer or recycler can install circuit 270 with or without installing circuit 280. Thus, during manufacturing and recycling, the manufacturer or recycler can select which functions are to be performed by the camera 10 simply by selectively installing or removing different modular circuits in flexible snaps 312, 314 and/or 316 and 318. Other structures can also be used to releasably hold the modular circuits. As in other embodiments, once that the modular circuits are installed in mounting 310, the second electronic circuit 306 formed by the modular circuits can be brought into engagement with the first electronic circuit 342 by joining cover 308 to frame 317 or by joining cover 308 to second cover 319.

Figure 12A:
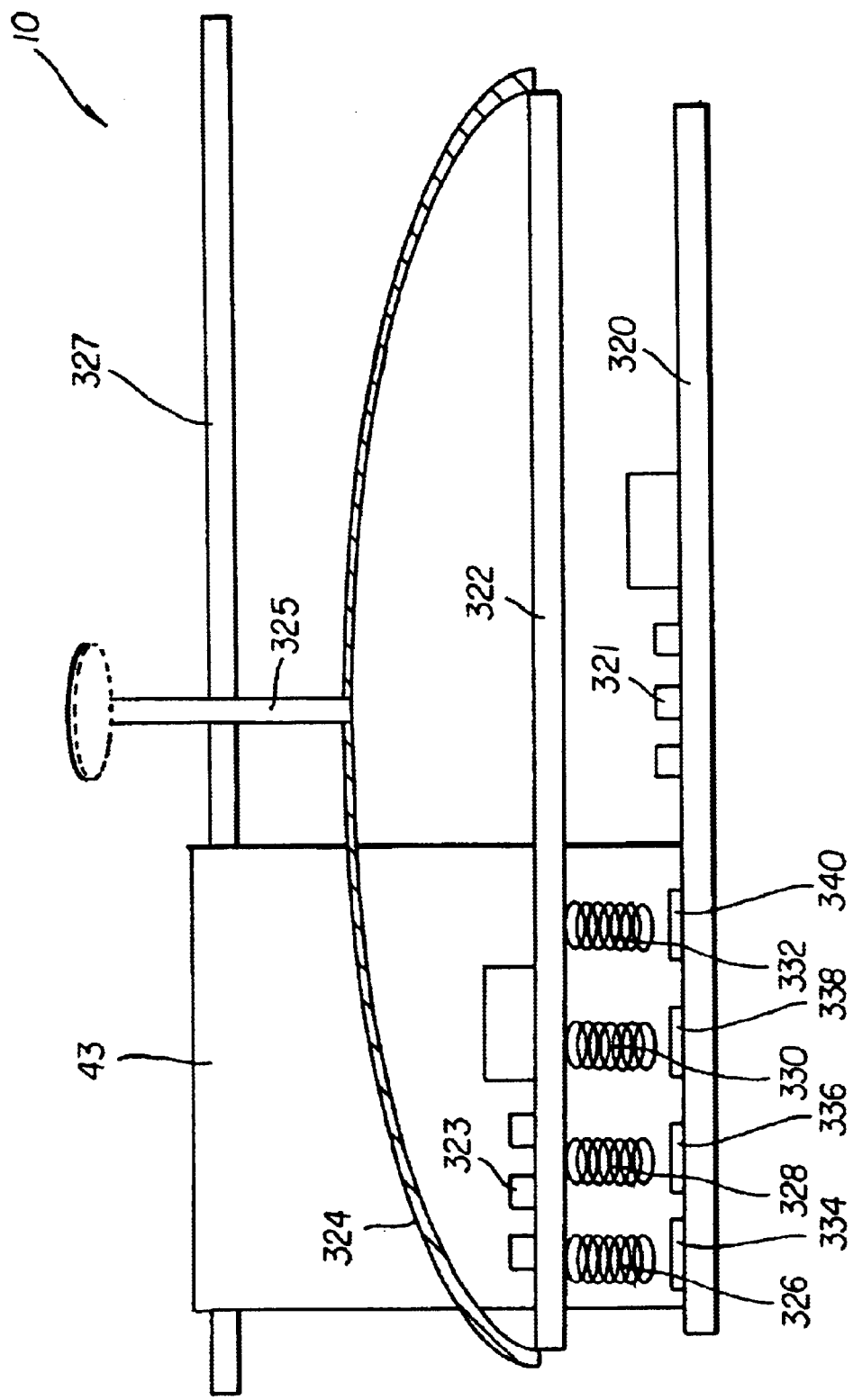
FIGS. 12a and 12b show an embodiment of amounting that permits the user of the camera to selectively cause the camera to perform either of a first or second set of camera functions.
Figure 12B:
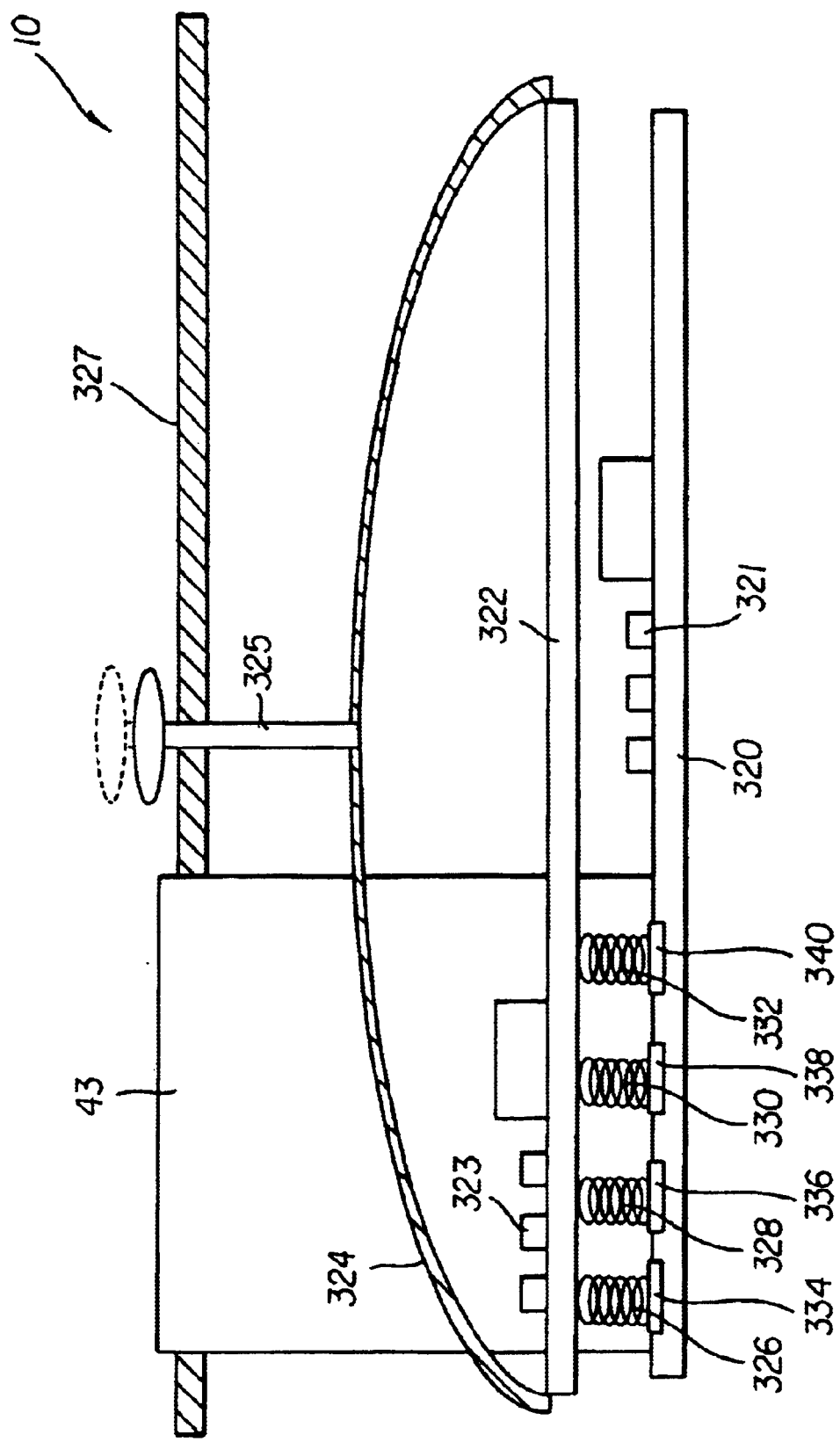

FIGS. 12a and 12b show an embodiment of camera 10 having first circuit board 320 with a first electronic circuit 321. In this regard a movable mounting 324 holds a second circuit board 322 having a second electronic circuit 323. The mounting is adjustably movable in response to a user control 325. User control 325 passes through camera cover 327 and which moves contacts 326, 328, 330 and 332 between a first position where contacts 326, 328, 330 and 332 of second circuit board 322 are separated from first circuit 320 as is shown in FIG. 13a and a second position where contacts 326, 328, 330 and 332 of second circuit board 322 engage contacts 334, 336, 338 and 340 of first circuit board 320 as is shown in FIG. 12b. Thus, where the user prefers that the camera 10 performs a first set of camera functions, the user can put control 325 in the first position. Similarly, where the user desires to have camera 10 execute the second set of camera functions, the user can put user control 325 in the second position. Mounting 324 can be defined to permit second circuit board 322 to be inserted or removed from camera 10 as desired during manufacturing and recycling.

Figure 13:
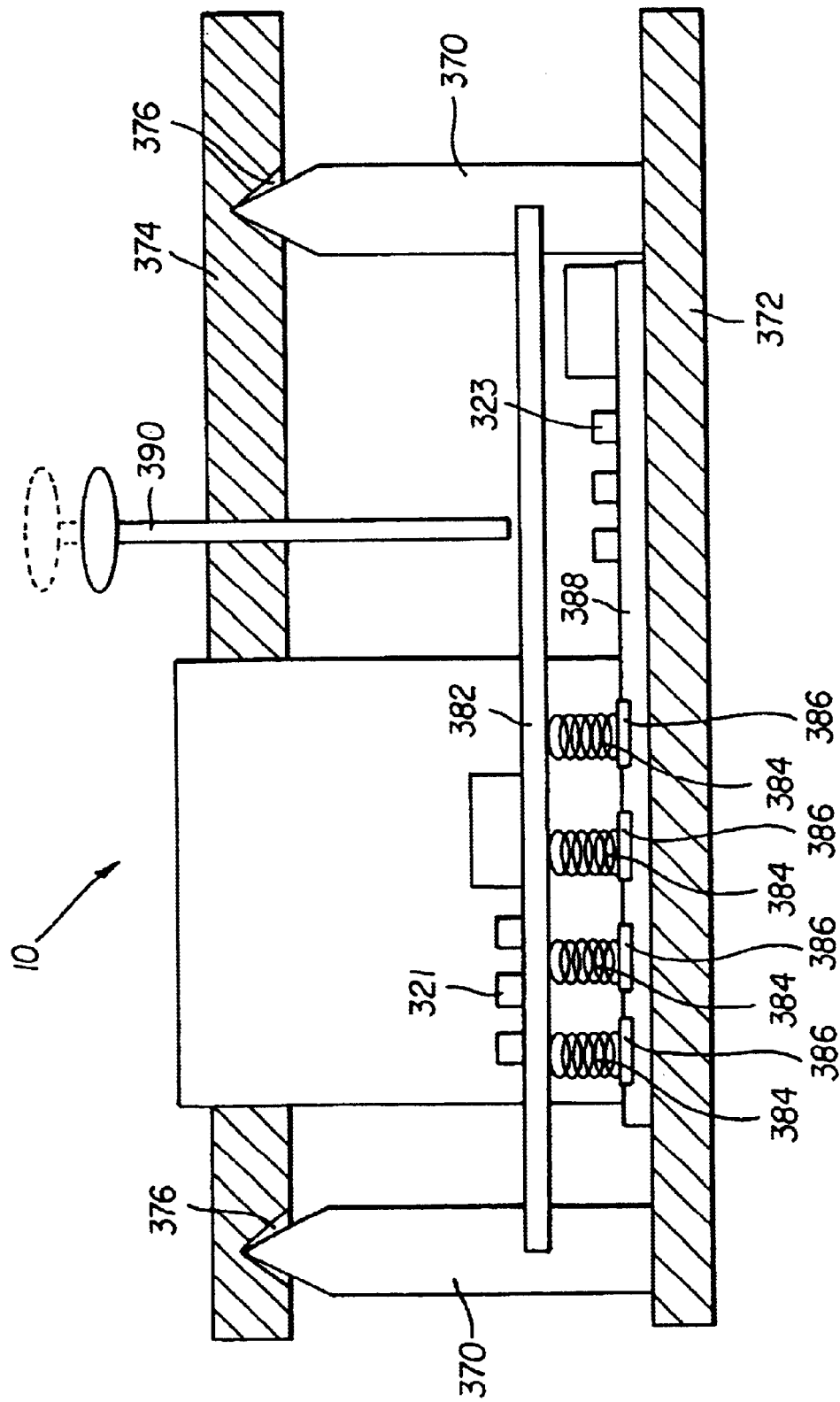
FIG. 13 shows an embodiment of a mounting that is separate from the cover or the frame of the camera

FIG. 13 shows another embodiment of the present invention wherein, a mounting 370 is provided that is separate from both a frame 372 and a cover 374. Mounting 370 however is positioned between frame 372 and cover 374 prior to assembly of camera 10. During assembly, alignment features 376 in camera cover 372 engage mounting features 378 to cause mounting 370 to be properly aligned and thereby to properly align the contacts 380 of a second circuit board 382 installed in mounting 370 with the contacts 384 of the second circuit board 382 properly aligned with and positioned to engage contacts 386 of a first circuit board 388. As is shown, the mounting 370 of this embodiment is used to position second circuit board 382 to block control feature 390 from contacting first electronic circuit board 388.

It will be appreciated that in any embodiment wherein the second circuit board blocks the path of travel of a control feature such as control feature 390, the control feature can exhibit a different control action when the second circuit board blocks the path of travel and when the second circuit board does not block the path of travel. Thus, it is possible, after manufacture and assembly of a camera 10 to determine the presence of a second circuit board simply by actuating the control feature and examining the control action.

The invention has been described in detail with particular reference to certain preferred embodiments thereof, but it will be understood that variations and modifications can be effected within the spirit and scope of the invention.

What is claimed is:

1. A camera, comprising:
   a first electronic circuit board having a first electronic circuit to perform a first set of camera functions, the first electronic circuit having a first set of electrical contacts;
   a second electronic circuit board having a second electronic circuit with a second set of electrical contacts to engage the first set of electrical contacts with the second electronic circuit defined to cooperate with the first electronic circuit to perform a second set of camera functions;
   a frame holding the first electronic circuit board;
   a cover joinable to the frame; and
   a mounting between the cover and the frame, for holding the second electronic circuit board and positioning the second set of electrical contacts with the mounting being adapted to cooperate with the cover so that as the cover is joined to the frame the second set of electrical contacts are positioned to engage the first set of electrical contacts to cause the first electronic circuit board to cooperate with the second electronic circuit to perform the second set of camera functions.

2. The camera of claim 1, wherein said second electronic circuit board comprises a flex circuit.

3. The camera of claim 2, wherein said mounting comprises alignment surfaces for aligning the second electronic circuit board with the first electronic circuit when the cover is joined to the frame.

4. The camera of claim 2, wherein said cover comprises clamps incorporated into the cover and pressuring the contacts of said flex circuit into engagement with contacts of the first electronic circuit.

5. The camera of claim 1, wherein the second electronic circuit board comprises more than one modular circuit with each modular circuit having modular contacts.

6. The camera of claim 1, wherein the mounting is integrally formed with the cover.

7. The camera of claim 1, wherein after the cover is joined to the frame, the mounting is selectably movable between a first position wherein the first set of contacts engage the second set of contacts and a second position wherein the first set of contacts is separate from the second set of contacts.

8. A camera, comprising:
   a first electronic circuit board having a first electronic circuit to perform a first set of camera functions, the first electronic circuit having a first set of electrical contacts;
   a second electronic circuit board having a second electronic circuit with a second set of electrical contacts to engage the first set of electrical contacts with the second electronic circuit defined to cooperate with the first electronic circuit to perform a second set of camera functions;
   a frame holding the first electronic circuit board;
   a cover joinable to the frame; and
   a mounting between the cover and the frame, for holding the second electronic circuit board and positioning the second set of electrical contacts so that when the cover is joined to the frame the second set of electrical contacts are positioned to engage the first set of electrical contacts to cause the first electronic circuit board to cooperate with the second electronic circuit to perform the second set of camera functions, wherein each modular circuit has a separate circuit board and each circuit board module is located in the mounting.

9. A camera, comprising:
   a first electronic circuit board having a first electronic circuit to perform a first set of camera functions, the first electronic circuit having a first set of electrical contacts;
   a second electronic circuit board having a second electronic circuit with a second set of electrical contacts to engage the first set of electrical contacts with the second electronic circuit defined to cooperate with the first electronic circuit to perform a second set of camera functions;
   a frame holding the first electronic circuit board;
   a cover joinable to the frame; and
   a mounting between the cover and the frame, for holding the second electronic circuit board and positioning the second set of electrical contacts so that when the cover is joined to the frame the second set of electrical contacts are positioned to engage the first set of electrical contacts to cause the first electronic circuit board to cooperate with the second electronic circuit to perform the second set of camera functions, wherein the mounting is fixed to the cover.

10. A camera, comprising:
    a cover;
    a drive member mounted to the cover and movable between a first position and a second position;
    a first circuit board having a first electronic circuit that performs at least one of a first set of camera functions in response to movement of the drive member into the second position;
    a second circuit board having a second electronic circuit that combines with the first electronic circuit to cause the combined circuit to perform a second set of camera functions; and
    a mounting positioning the second electronic circuit board between the drive member and the first electronic circuit, said second electronic circuit board positioned to block movement of the drive member at a third position and to prevent movement of the drive member into the second position.

11. The camera of claim 10, wherein said second electronic circuit detects when the drive member is in the third position and executes at least one of the second set of camera functions when the second electronic circuit detects that the drive member is in the third position.

12. The camera of claim 11, wherein the second electronic circuit further comprises a normally open switch that is closed by movement of the drive member into the third position said second electronic circuit executing at least one of the second set of camera functions in response to the closure of the switch.

13. The camera of claim 11, wherein the second electronic circuit further comprises a normally closed switch that is opened by movement of the drive member into the third position said second electronic circuit executing at least one of the second set of camera functions in response to the opening of the switch.

14. The camera of claim 10, wherein said mounting is fixed to the cover.

15. The camera of claim 10, wherein said mounting comprises flexible snaps for holding the second circuit board.

16. The camera of claim 15, wherein said first electronic circuit is fixed to a frame and said mounting is fixed to the frame.

17. The camera of claim 10, wherein the second circuit board comprises more than one separate module.

18. The camera of claim 17, wherein said mounting comprises more than one flexible snap with a flexible snap provided for each of the more than one separate module.

19. The camera of claim 17, wherein said cover comprises surfaces that position the mounting to align the contacts of the second electronic circuit with the contacts of the first electronic circuit for combination therewith as the cover is mounted to the frame.

20. The camera of claim 10, further comprising a frame joined to the first circuit board wherein the cover is fixed to the frame during camera assembly and the mounting is interposed between the cover and the frame so that when the cover is fixed to the frame, the second electronic circuit is brought into combination with the first electronic circuit.

21. A method of assembling a camera to perform a desired set of functions; comprising:

providing a camera frame having a first electronic system capable of performing a first set of camera functions;

determining that the first electronic system cannot perform the set of desired functions;

providing a mounting having a second electronic system to cooperate with the first electronic system to perform the desired functions;

providing a camera cover adapted to cooperate with the mounting and the frame to position the second electronic system to cooperate with the first electronic system when the camera cover is assembled to the frame; and assembling the camera cover to the frame so that the first electronic system is joined to the second electronic system.

22. The method of claim 21, wherein the step of providing a mounting having a second electronic system comprises assembling more than one modular circuit in the mounting.

23. The method of claim 21, wherein the step of providing a second electronic circuit comprises providing a flexible circuit.

24. A method of assembling a camera to perform a desired set of functions; comprising:

providing a camera frame having a first electronic system capable of performing a first set of camera functions;

determining that the first electronic system cannot perform the set of desired functions;

providing a mounting having a second electronic system to cooperate with the first electronic system to perform the desired functions;

providing a camera cover; and assembling the camera cover to the frame with the mounting held therebetween so that the first electronic system is joined to the second electronic system, wherein the steps of providing a mounting and providing a camera cover comprise providing a camera cover having a mounting.

25. A method of assembling a camera to perform a desired set of functions; comprising:

providing a camera frame having a first electronic system capable of performing a first set of camera functions;

determining that the first electronic system cannot perform the set of desired functions;

providing a mounting having a second electronic system to cooperate with the first electronic system to perform the desired functions;

providing a camera cover; and assembling the camera cover to the frame with the mounting held therebetween so that the first electronic system is joined to the second electronic system, wherein the step of providing a camera cover comprises providing a camera cover having a drive member passing through the cover and movable between a first position engaging the first circuit board and a second position.

26. The method of claim 25, wherein the step of providing a mounting comprises providing a mounting that positions the second circuit board between the first and second positions of the driving member to prevent the driving member from moving into the second position.

27. The method of claim 26, wherein the step of providing a camera cover comprises the step of providing a camera cover having a lever adapted to engage the switchable member.

28. A method of assembling a camera to perform a desired set of functions; comprising:

providing a camera frame having a first electronic system capable of performing a first set of camera functions;

determining that the first electronic system cannot perform the set of desired functions;

providing a mounting having a second electronic system to cooperate with the first electronic system to perform the desired functions;

providing a camera cover; and assembling the camera cover to the frame with the mounting held therebetween so that the first electronic system is joined to the second electronic system, wherein the flexible circuit cooperates with the first electronic circuit to provide a switchable member.

* * * * *

UNITED STATES PATENT AND TRADEMARK OFFICE
CERTIFICATE OF CORRECTION

PATENT NO. : 6,871,016 B2  
DATED : March 22, 2005  
INVENTOR(S) : Douglas W. Constable Page 1 of 1

It is certified that error appears in the above-identified patent and that said Letters Patent is hereby corrected as shown below:

<u>Column 2,</u>
Line 47, replace "2001-228412A" with -- 2001-228512A --
Line 63, replace "'412" with -- '512 --

<u>Column 5,</u>
Lines 17, 18, 19 and 57, replace "member 47" with -- member 68 --

Signed and Sealed this

Twenty-eighth Day of June, 2005

JON W. DUDAS
*Director of the United States Patent and Trademark Office*